United States Patent
Li et al.

(10) Patent No.: US 12,046,698 B2
(45) Date of Patent: Jul. 23, 2024

(54) OPTOELECTRONIC DEVICE HAVING A BORON NITRIDE ALLOY ELECTRON BLOCKING LAYER AND METHOD OF PRODUCTION

(71) Applicant: KING ABDULLAH UNIVERSITY OF SCIENCE AND TECHNOLOGY, Thuwal (SA)

(72) Inventors: Xiaohang Li, Thuwal (SA); Wenzhe Guo, Thuwal (SA); Haiding Sun, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 17/350,163

(22) Filed: Jun. 17, 2021

(65) Prior Publication Data
US 2021/0313489 A1 Oct. 7, 2021

Related U.S. Application Data

(62) Division of application No. 16/637,432, filed as application No. PCT/IB2018/056988 on Sep. 12, 2018, now Pat. No. 11,069,834.

(Continued)

(51) Int. Cl.
*H01L 33/14* (2010.01)
*H01L 27/15* (2006.01)
(Continued)

(52) U.S. Cl.
CPC ............ *H01L 33/145* (2013.01); *H01L 27/15* (2013.01); *H01L 29/2003* (2013.01);
(Continued)

(58) Field of Classification Search
CPC ... H01L 27/15; H01L 29/2003; H01L 29/205; H01L 29/7786; H01L 33/007; H01L 33/06; H01L 33/145; H01L 33/32; H01L 33/04
See application file for complete search history.

(56) References Cited

U.S. PATENT DOCUMENTS

| 5,895,938 A | 4/1999 | Watanabe et al. |
| 6,841,806 B1 | 1/2005 | Taylor et al. |
| | (Continued) | |

FOREIGN PATENT DOCUMENTS

| CN | 1617363 A | 5/2005 |
| CN | 1622350 A | 6/2005 |
| | (Continued) | |

OTHER PUBLICATIONS

Sun et al., "Nearly-zero valence band and large conduction band offset at BAlN/GaN heterointerface for optical and power device application," Applied Surface Science 458 (2018) pp. 949-953.*

(Continued)

*Primary Examiner* — Jay C Kim
(74) *Attorney, Agent, or Firm* — PATENT PORTFOLIO BUILDERS PLLC

(57) ABSTRACT

An optoelectronic device a substrate, a first doped contact layer arranged on the substrate, a multiple quantum well layer arranged on the first doped contact layer, a boron nitride alloy electron blocking layer arranged on the multiple quantum well layer, and a second doped contact layer arranged on the boron nitride alloy electron blocking layer.

12 Claims, 10 Drawing Sheets

Related U.S. Application Data

(60) Provisional application No. 62/559,842, filed on Sep. 18, 2017.

(51) Int. Cl.

| | | |
|---|---|---|
| *H01L 29/20* | (2006.01) | |
| *H01L 29/205* | (2006.01) | |
| *H01L 29/778* | (2006.01) | |
| *H01L 33/00* | (2010.01) | |
| *H01L 33/06* | (2010.01) | |
| *H01L 33/32* | (2010.01) | |

(52) U.S. Cl.
CPC ........ *H01L 29/205* (2013.01); *H01L 29/7786* (2013.01); *H01L 33/007* (2013.01); *H01L 33/06* (2013.01); *H01L 33/32* (2013.01)

(56) References Cited

U.S. PATENT DOCUMENTS

| | | | |
|---|---|---|---|
| 7,265,374 B2* | 9/2007 | Lee | H01L 33/22 977/773 |
| 7,800,097 B2 | 9/2010 | Hirose et al. | |
| 8,183,556 B2 | 5/2012 | Dattà et al. | |
| 8,455,856 B1 | 6/2013 | Hersee | |
| 9,054,232 B2 | 6/2015 | Chung | |
| 9,093,581 B2* | 7/2015 | Jiang | H01L 31/03048 |
| 9,478,718 B2* | 10/2016 | Kim | H01L 33/145 |
| 9,660,133 B2 | 5/2017 | Jain et al. | |
| 9,894,723 B2 | 2/2018 | Simin et al. | |
| 9,948,062 B2 | 4/2018 | Simin et al. | |
| 10,002,862 B2 | 6/2018 | Simin et al. | |
| 10,069,034 B2* | 9/2018 | Jain | H01L 33/04 |
| 10,141,371 B2 | 11/2018 | Odnoblyudov et al. | |
| 10,237,929 B2 | 3/2019 | Simin et al. | |
| 10,431,504 B2 | 10/2019 | Lehnert et al. | |
| 10,672,884 B2 | 6/2020 | Dasgupta et al. | |
| 10,890,712 B2 | 1/2021 | Soitani et al. | |
| 11,348,908 B2* | 5/2022 | Yonkee | H01L 33/46 |
| 2005/0110029 A1 | 5/2005 | Aoyagi et al. | |
| 2008/0258170 A1* | 10/2008 | Hsu | H01L 33/40 257/E33.059 |
| 2013/0292685 A1 | 11/2013 | Jiang et al. | |
| 2016/0005919 A1* | 1/2016 | Obata | H01L 33/145 257/13 |
| 2019/0346705 A1 | 11/2019 | Soltani et al. | |

FOREIGN PATENT DOCUMENTS

| | | |
|---|---|---|
| JP | 2000332295 A | 11/2000 |
| WO | 2008057193 A1 | 5/2008 |

OTHER PUBLICATIONS

Sun et al., "Revealing microstructure and dislocation behavior in BAlN/AlGaN heterostructures," Applied Physics Express 11 (2018) 011001.*

Sun et al., "Band alignment of B0.14Al0.86N/Al0.7Ga0.3N heterojunction," Applied Physics Letters 111 (2017) 122106.*

Park et al., "Dip-Shaped AlGaN/AlN Light-Emitting Diodes With Delta-Layer Containing Boron," IEEE Photonics Technology Letters 29 (2017) pp. 1042-1045.*

Abid, "Design and Epitaxial Growth of Vertical Cavity Surface-Emitting Lasers (VCSEL) Emitting At Ultraviolet Wavelength," PhD Dissertation at Georgia Institute of Technology (2013).*

Jiang et al., "Hexagonal boron nitride for deep ultraviolet photonic devices," Semiconductor Science & Technology 29 (2014) 084003.*

Abid, M. et al., "Distributed Bragg Reflectors Based on Diluted Boron-Based BAlN Alloys for Deep Ultraviolet Optoelectronic Applications," Applied Physical Letters, Jan. 30, 2012, vol. 100, pp. 051101-1-051101-4, American Institute of Physics.

Choi, S. et al., "Improvement of Peak Quantum Efficiency and Efficiency Droop in III-Nitride Visible Light-Emitting Diodes with an InAlN Electron-Blocking Layer," Applied Physical Letters, vol. 96, pp. 221105-1-221105-3, American Institute of Physics.

Dai, Q. et al., "Carrier Recombination Mechanisms and Efficiency Droop in GaInN/GaN Light-Emitting Diodes," Applied Physical Letters, Sep. 30, 2010, vol. 97, pp. 133507-1-133507-3, American Institute of Physics.

First Office Action in corresponding/related Chinese Application No. 201880060084.4, dated Sep. 21, 2020 (US2013292685A1, WO2008057193A1 and JP2000332295A were cited in the IDS filed Feb. 27, 2020).

Han, S.-H. et al., "Effect of Electron Blocking Layer on Efficiency Droop in InGaN/GaN Multiple Quantum Well Light-Emitting Diodes," Applied Physical Letters, Jun. 12, 2009, vol. 94, pp. 231123-1-231123-3, American Institute of Physics.

International Search Report in corresponding/related International Application No. PCT/IB2018/056988, date of mailing Dec. 21, 2018.

Li, X et al., "100-nm Thick Single-Phase Wurtzite BAlN Films with Boron Contents Over 10%," Physica Status Solidi B, Jan. 11, 2017, vol. 254, No. 8, 1600699, 5 pages, Wiley-VCH Verlag GmbH & Co. KGaA, Weinheim.

Li, X. et al., "MOVPE Grown Periodic AlN/BAlN Heterostructure with High Boron Content," Journal of Crystal Growth, Sep. 28, 2014, vol. 414, pp. 119-122, Elsevier B.V.

Liu, Z. et al., "p-InGaN/AlGaN Electron Blocking Layer for InGaN/GaN Blue Light-Emitting Diodes," Applied Physical etters, Dec. 27, 2012, vol. 101, pp. 261106-1-261106-4, American Institute of Physics.

Piprek, J. et al., "On the Uncertainty of the Auger Recombination Coefficient Extracted from InGaN/GaN Light-Emitting Diode Efficiency Droop Measurements," Applied Physical Letters, Mar. 10, 2015, vol. 106, pp. 101101-1-101101-4, American Institute of Physics.

Sun, H. et al., "Band Alignment of B0.14Al0.86N/Al0.7Ga0.3N Heterojunction," Applied Physical Letters, Sep. 21, 2017, vol. 111, pp. 122106-1-122106-5, American Institute of Physics.

Wang, S. et al., "Crystal Structure and Composition of BAlN Thin Films: Effect of Boron Concentration in the Gas Flow," Journal of Crystal Growth, Jul. 20, 2017, vol. 475, pp. 334-340, Elsevier B.V.

Written Opinion of the International Searching Authority in corresponding/related International Application No. PCT/IB2018/056988, date of mailing Dec. 21, 2018.

Zhang, Y.Y. et al., "Performance Enhancement of Blue Light-Emitting Diodes with a Special Designed AlGaN/GaN Superlattice Electron-Blocking Layer," Applied Physical Letters, Nov. 28, 2011, vol. 99, pp. 221103-1-221103-3, American Institute of Physics.

* cited by examiner

OPTOELECTRONIC DEVICE HAVING A BORON NITRIDE ALLOY ELECTRON BLOCKING LAYER AND METHOD OF PRODUCTION

CROSS-REFERENCE TO RELATED APPLICATIONS

This application is a Divisional Application of U.S. application Ser. No. 16/637,432, filed Feb. 7, 2020, which is a U.S. National Stage Application of International Application No. PCT/IB2018/056988, filed on Sep. 12, 2018, which claims priority to U.S. Provisional Patent Application No. 62/559,842, filed Sep. 18, 2017, entitled "SIGNIFICANT PERFORMANCE IMPROVEMENT OF BLUE AND UV LIGHT-EMITTING DIODE BY APPLYING BAlN ELECTRON BLOCKING LAYER," the disclosures of which are incorporated herein by reference in their entirety.

BACKGROUND

Technical Field

Embodiments of the disclosed subject matter generally relate to an optoelectronic device having a boron nitride alloy electron blocking layer to improve efficiency of the optoelectronic device, and a method of production.

Discussion of the Background

Light emitting diodes are increasingly being used in place of other light emitting devices (e.g., incandescent or fluorescent light emitting devices) due to the higher efficiency of light emitting diodes and the ability to produce light emitting diodes that are much smaller than other types of light emitting devices. The common problems in light emitting diodes are the leakage of electrons from the active layer and low hole injection, which reduces device efficiency.

One solution to reduce leakage of electrons from the active layer is to provide an electron blocking layer (EBL) between the top-most quantum barrier and the top contact layer. For example, blue light emitting diodes have been produced using an aluminum gallium nitride (AlGaN) electron blocking layer and having multiple quantum well layer comprising multiple indium gallium nitride (InGaN) active layers and gallium nitride (GaN) barrier layers. To avoid undesired polarization and bad crystalline quality due to a large lattice mismatch between the aluminum gallium nitride electron blocking layer and the indium gallium nitride active layer, the aluminum content of the electron blocking layer is typically limited to 30% of the alloy composition. This limit on the aluminum content, however, limits the effectiveness of the aluminum gallium nitride electron blocking layer. Further, hole injection into the active layer deteriorates due to a large valence band offset (VBO). Accordingly, studies have shown that an aluminum gallium nitride electron blocking layer fails to effectively attenuate electron leakage, and thus results in efficiency droop, i.e., the internal quantum efficiency decreases as the current density increases.

Thus, it would be desirable to provide for an optoelectronic device having an electron blocking layer that effectively blocks electron leakage from the active layer and facilitates hole injection.

SUMMARY

According to an embodiment, there is an optoelectronic device, which includes a substrate, a first doped contact layer arranged on the substrate, a multiple quantum well layer arranged on the first doped contact layer, a boron nitride alloy electron blocking layer arranged on the multiple quantum well layer, and a second doped contact layer arranged on the boron nitride alloy electron blocking layer.

According to another embodiment, there is method of forming an optoelectronic device. A first doped contact layer is formed on a substrate. A multiple quantum well layer is formed on the first doped contact layer. A boron nitride alloy electron blocking layer is formed on the multiple quantum well layer. A second doped contact layer is formed on the boron nitride alloy electron blocking layer.

According to a further embodiment, there is an optoelectronic device, which includes a light emitting diode comprising a multiple quantum well layer, an electron blocking layer, a first doped contact layer and a second doped contact layer, and a high electron mobility transistor having a two-dimensional electron gas channel layer and the electron blocking layer. The two-dimensional electron gas channel layer of the high electron mobility transistor is comprised of a last barrier layer of the multiple quantum well layer of the light emitting diode. The electron blocking layer is a boron nitride alloy electron blocking layer arranged on the two-dimensional electron gas channel layer of the high electron mobility transistor.

BRIEF DESCRIPTION OF THE DRAWINGS

The accompanying drawings, which are incorporated in and constitute a part of the specification, illustrate one or more embodiments and, together with the description, explain these embodiments. In the drawings:

FIGS. 10A and 10B are graphs of the bandedge profiles of optoelectronic devices having different electron blocking layers according to embodiments;

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of optoelectronic devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
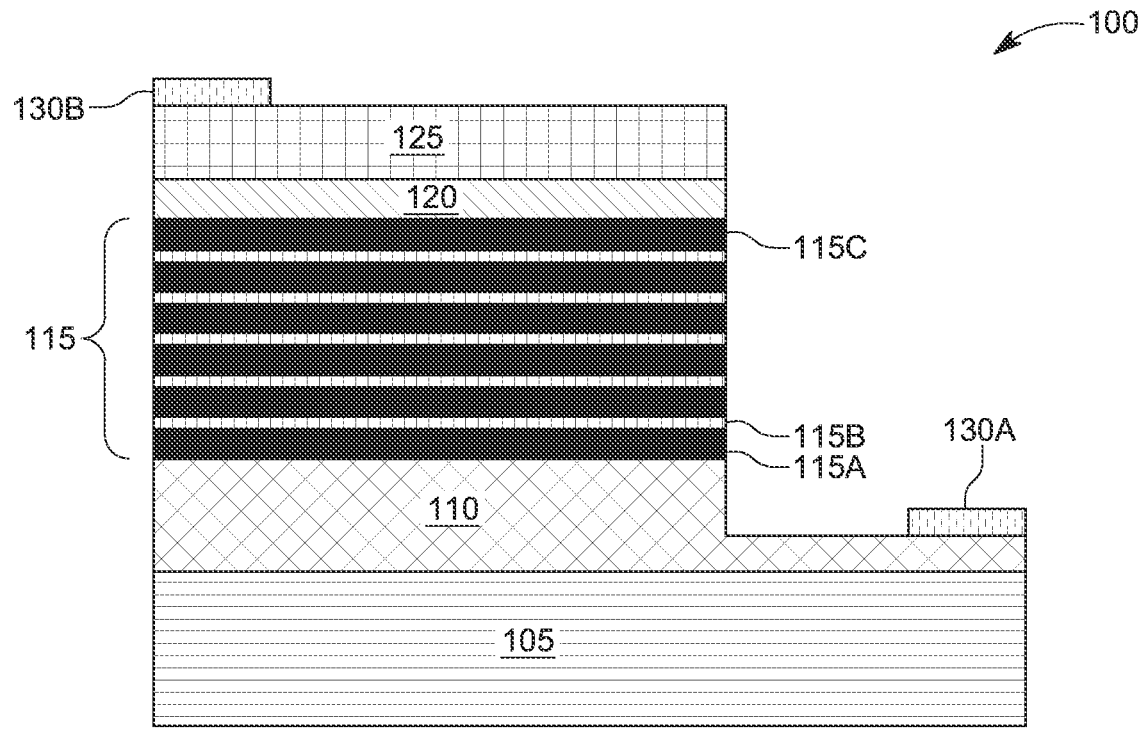
FIG. 1 is a block diagram of an optoelectronic device according to embodiments.

FIG. 1 is a block diagram of an optoelectronic device according to embodiments. The optoelectronic device 100 includes a substrate 105 and a first doped contact layer 110 arranged on the substrate 105. A multiple quantum well layer 115 is arranged on the first doped contact layer 110. A boron nitride alloy electron blocking layer 120 is arranged on the multiple quantum well layer 115. A second doped contact layer 125 is arranged on the boron nitride alloy electron blocking layer 120. The optoelectronic device 100 is a light emitting diode.

In an embodiment, the substrate 105 can be, for example, a sapphire substrate. The first doped contact layer 110 can be, for example, a 3 μm n-type gallium nitride GaN layer. The doping of the first contact layer 110 can be, for example, $5 \times 10^{18}$ cm$^{-3}$ n-type doping (e.g., silicon doping). In another embodiment, the first doped contact layer 110 can be an aluminum gallium nitride layer. The multiple quantum well layer 115 comprises a plurality of interlaced barrier layers 115A and active layers 115B (only two of which are labeled). In an embodiment, the barrier layers 115A can be, for example, 8 nm thick gallium nitride layers and the active layers 115B can be, for example, 2 nm thick indium gallium nitride layers. In one embodiment, the indium gallium nitride active layers 115B can be $In_{0.20}Ga_{0.80}N$ layers. In another embodiment, the active layers 115B can be an aluminum gallium nitride layer. The multiple quantum well layer 115 also includes a sixth barrier layer 115C, which can be thicker than the other barrier layers 115A. For example, the sixth barrier layer 115C can be 18 nm thick. Although the illustrated embodiment includes five barrier 115A and active 115B layers, the multiple quantum well layer 115 can include more or fewer than five barrier 115A and active 115B layers.

The boron nitride alloy layer 120 can be, for example, boron aluminum nitride (BAlN) layer. In one embodiment, the composition of the boron nitride alloy layer 120 is $B_{0.14}Al_{0.86}N$. It should be recognized, however, that the amount of boron and aluminum can be different from that of $B_{0.14}Al_{0.86}N$, so long as there is some boron, which as discussed below results in an optoelectronic device with a bandedge profile that contributes to a higher electron blocking barrier and lower hole barrier so that fewer electrons escape from the active layers and more holes are injected into the active layers. The second doped contact layer 125 can be, for example, a 100 nm p-type GaN layer. The doping of the second contact layer 125 can be, for example, $2 \times 10^{18}$ cm$^{-3}$ p-type doping (e.g., magnesium doping). In another embodiment, the second doped contact layer 125 can be an aluminum gallium nitride layer. The optoelectronic device 100 also includes electrodes 130A and 130B for powering the device. An optoelectronic device 100 configured as described above operates as a blue light emitting diode.

Figure 2:
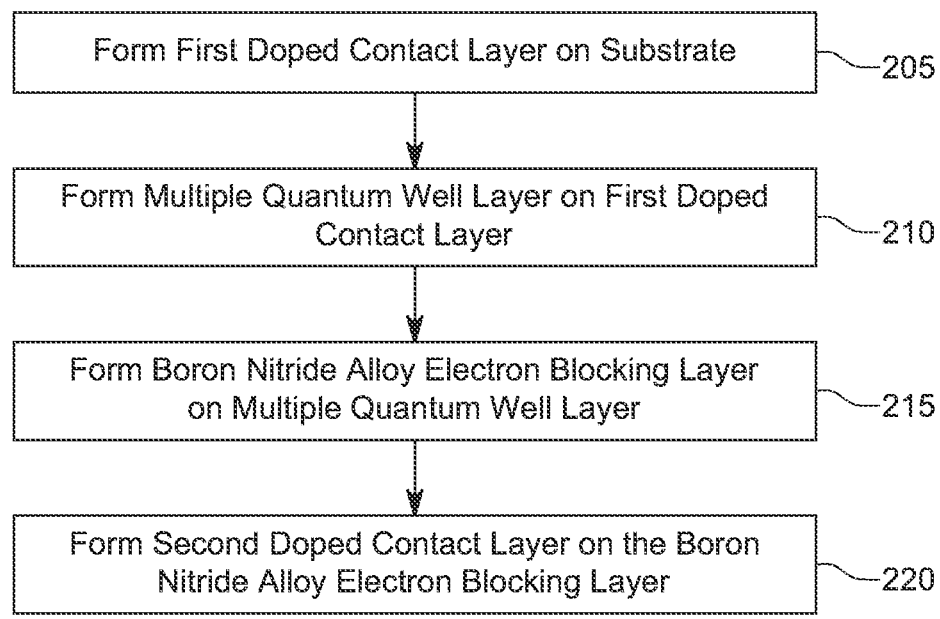
FIG. 2 is a flowchart of a method of forming an optoelectronic device according to embodiments.

FIG. 2 is a flowchart of a method of forming an optoelectronic device according to embodiments. Initially, a first doped contact layer 110 is formed on the substrate 105 (step 205). A multiple quantum well layer 115 is then formed on the first doped contact layer 110 (step 210). A boron nitride alloy electron blocking layer 120 is formed on the multiple quantum well layer 115 (step 215). A second doped contact layer 125 is formed on the boron nitride alloy electron blocking layer 120 (step 220). The electrodes 130A and 130B can then be formed.

The method illustrated in the flowchart of FIG. 2 can be performed using any technique suitable for the materials of the various layers. In one embodiment, the optoelectronic device 100 can be formed using, for example, metalorganic chemical vapor deposition (MOCVD).

The disclosed optoelectronic device having a boron nitride alloy electron blocking layer was evaluated with respect to a similar device having an aluminum gallium nitride electron block layer. The two devices were identical except for the composition and thickness of the electron blocking layer and the thickness of the sixth barrier layer. Specifically, an 18 nm sixth blocking layer was employed in the device having a boron nitride alloy electron blocking layer and the boron nitride alloy electron blocking layer was a 10 nm thick $B_{0.14}Al_{0.86}N$ layer. An 8 nm sixth blocking layer was employed in the device having an aluminum gallium nitride electron blocking layer and the aluminum gallium nitride electron blocking layer was a 20 nm thick $Al_{0.15}Ga_{0.85}N$ layer.

Figure 3A:
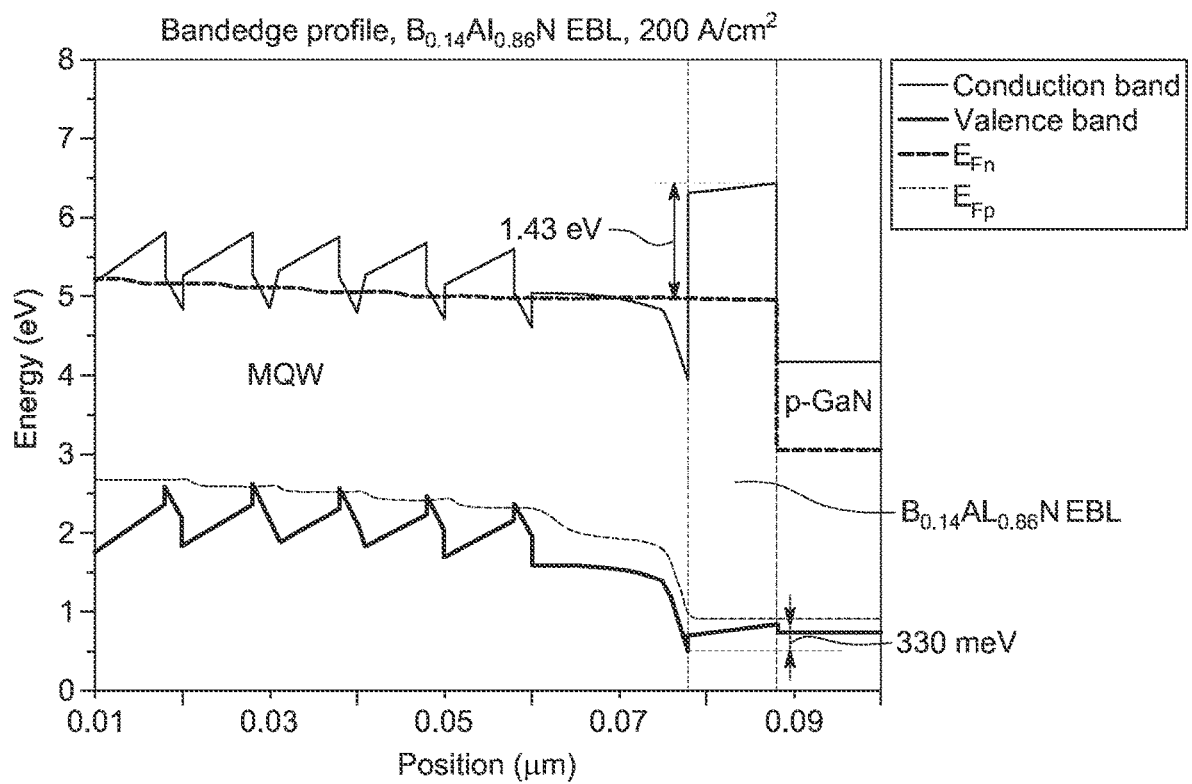
FIGS. 3A and 3B are graphs of the bandedge profiles of optoelectronic devices having different electron blocking layers according to embodiments.
Figure 3B:
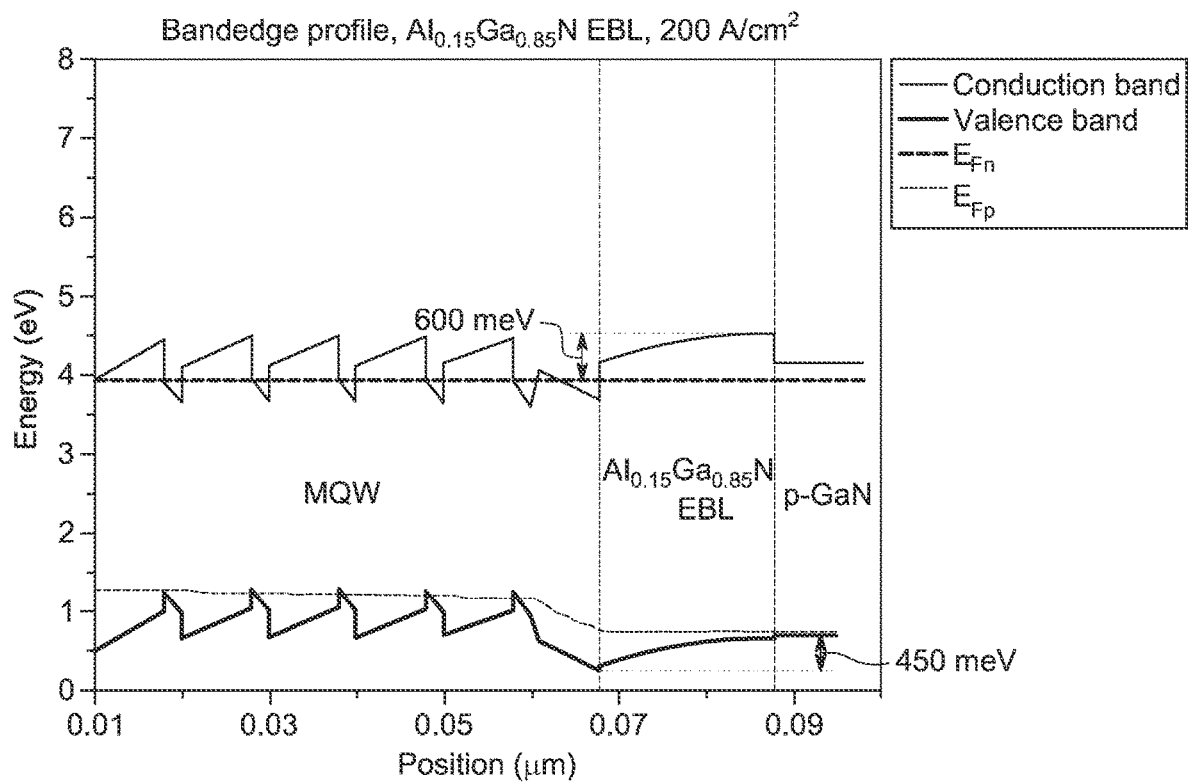

FIGS. 3A and 3B are graphs of the bandedge profiles of optoelectronic devices having a $B_{0.14}Al_{0.86}N$ electron blocking layer and an $Al_{0.15}Ga_{0.85}N$ electron blocking layer, respectively at 200 A/cm$^2$. As illustrated, the optoelectronic device having a $B_{0.14}Al_{0.86}N$ electron blocking layer has a more favorable hole potential barrier height of 330 meV compared to the 450 meV hole potential barrier height of the optoelectronic device having an AlGaN electron blocking layer. Thus, the optoelectronic device having a $B_{0.14}Al_{0.86}N$ electron blocking layer allows for greater hole insertion compared to the optoelectronic device having an $Al_{0.15}Ga_{0.85}N$ electron blocking layer.

Further, the optoelectronic device having a $B_{0.14}Al_{0.86}N$ electron blocking layer has a more favorable electron potential barrier height of 1.43 eV compared to the 600 meV electron potential barrier height of the optoelectronic device having an $Al_{0.15}Ga_{0.85}N$ electron blocking layer. Thus, more electrons are blocked in the optoelectronic device having a $B_{0.14}Al_{0.86}N$ electron blocking layer compared to the optoelectronic device having an $Al_{0.15}Ga_{0.85}N$ electron blocking layer.

Figure 4A:
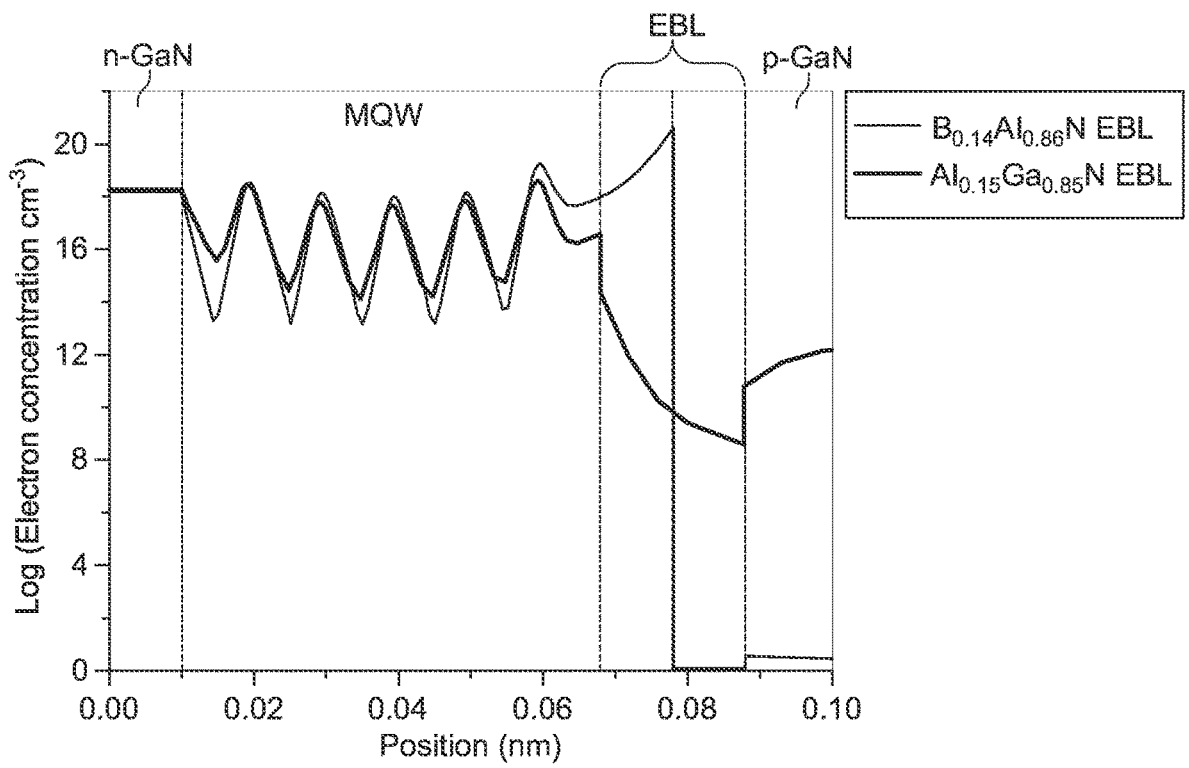
FIGS. 4A and 4B are graphs of electron and hole carrier density, respectively, of optoelectronic devices having different electron blocking layers according to embodiments.
Figure 4B:
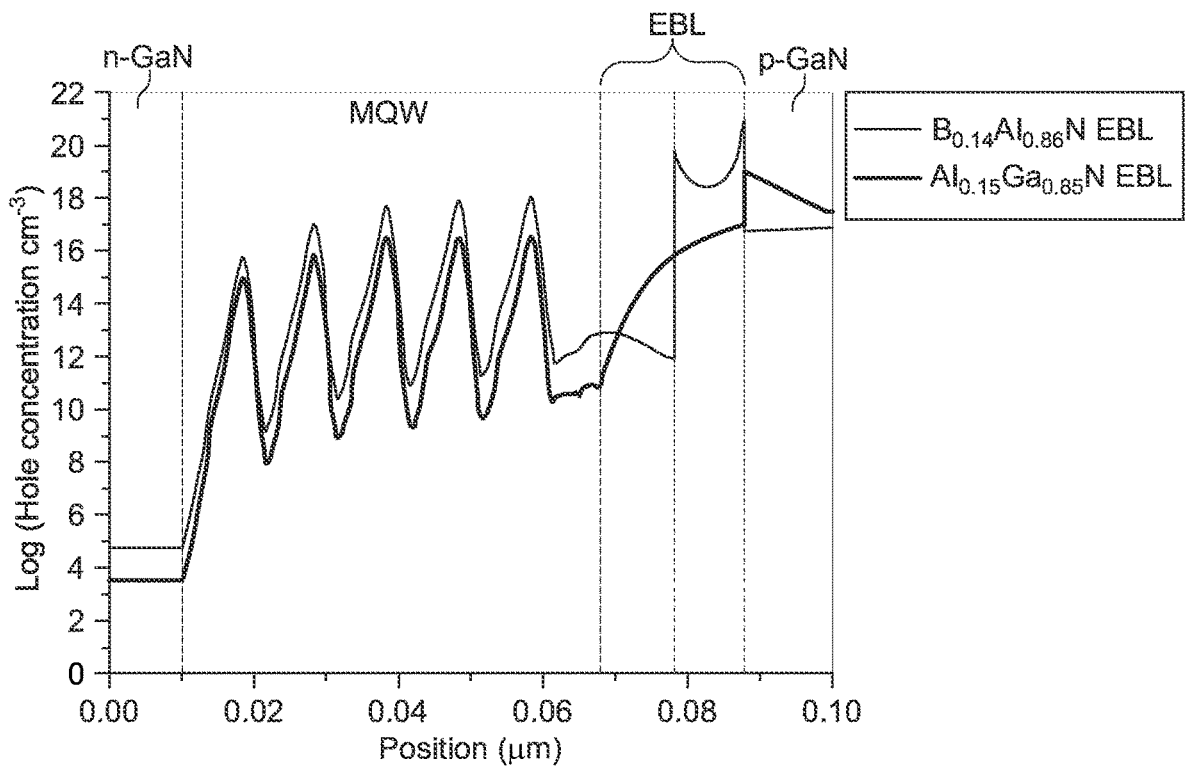

To understand the corresponding carrier distribution, the electron and hole concentrations at the current density of 200 A/cm² were evaluated, the results of which are illustrated in logarithmic scale in FIGS. 4A and 4B. As illustrated, the larger electron potential barrier and smaller hole potential barrier of the optoelectronic device having a $B_{0.14}Al_{0.86}N$ electron blocking layer compared to the optoelectronic device having an $Al_{0.15}Ga_{0.85}N$ results in reduced electron leakage from and increased hole concentration in the quantum wells. As illustrated in FIG. 4A, the electron concentration in the optoelectronic device having a $B_{0.14}Al_{0.86}N$ electron blocking layer increases within the last three quantum wells, whereas the electron concentration in the optoelectronic device having an $Al_{0.15}Ga_{0.85}N$ electron blocking layer remains at the lower level. The electron concentration then significantly drops at the interface between the sixth barrier layer and the $B_{0.14}Al_{0.86}N$ electron blocking layer, whereas the drop is less significant at the interface between the sixth barrier layer and the $Al_{0.15}Ga_{0.85}N$ electron blocking layer. This demonstrates that the $B_{0.14}Al_{0.86}N$ electron blocking layer blocks significantly more electrons than the $Al_{0.15}Ga_{0.85}N$ electron blocking layer.

Turning now to FIG. 4B, the hole concentration in the device having a $B_{0.14}Al_{0.86}N$ electron blocking layer is increased significantly in the five quantum wells due to more hole injection resulting from lower hole potential height. The improved hole injection can be also confirmed by a lower hole concentration at the interface between EBL and p-GaN layer, which demonstrates that $B_{0.14}Al_{0.86}N$ electron blocking layer allows for significantly more hole injection than the $Al_{0.15}Ga_{0.85}N$ electron blocking layer.

Figure 5:
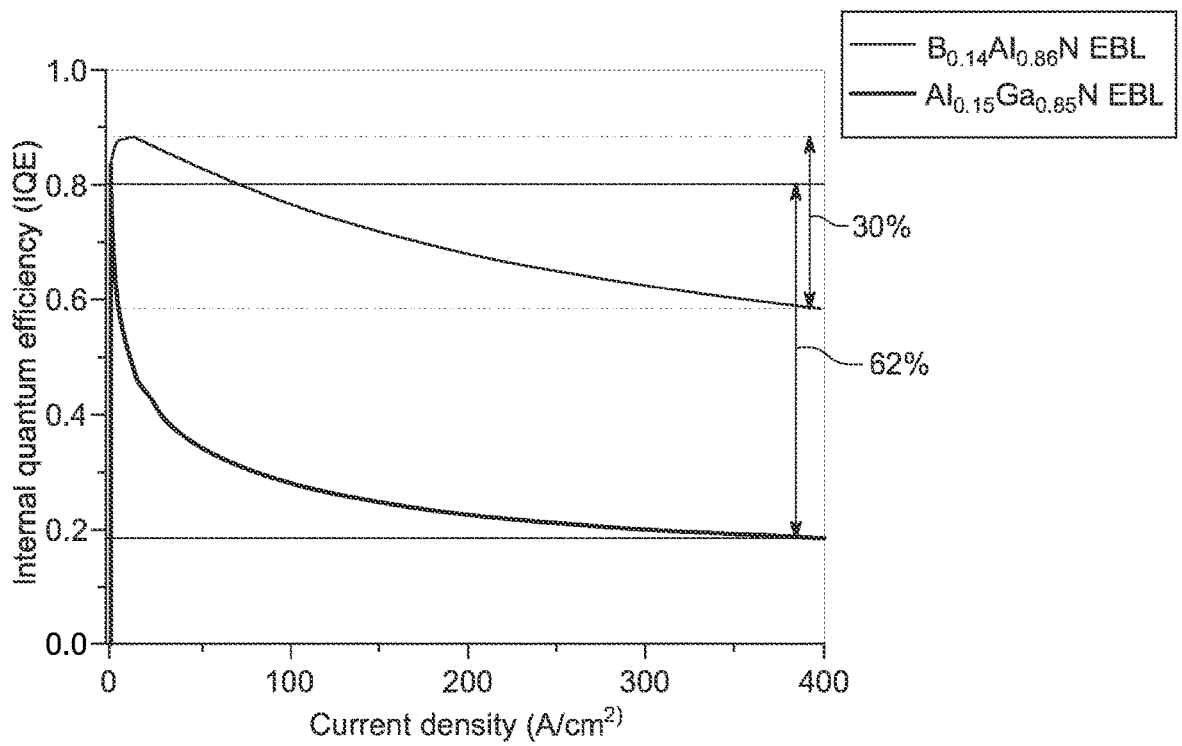
FIG. 5 is a graph of the internal quantum efficiency of optoelectronic devices having different electron blocking layers according to embodiments.
Figure 6:
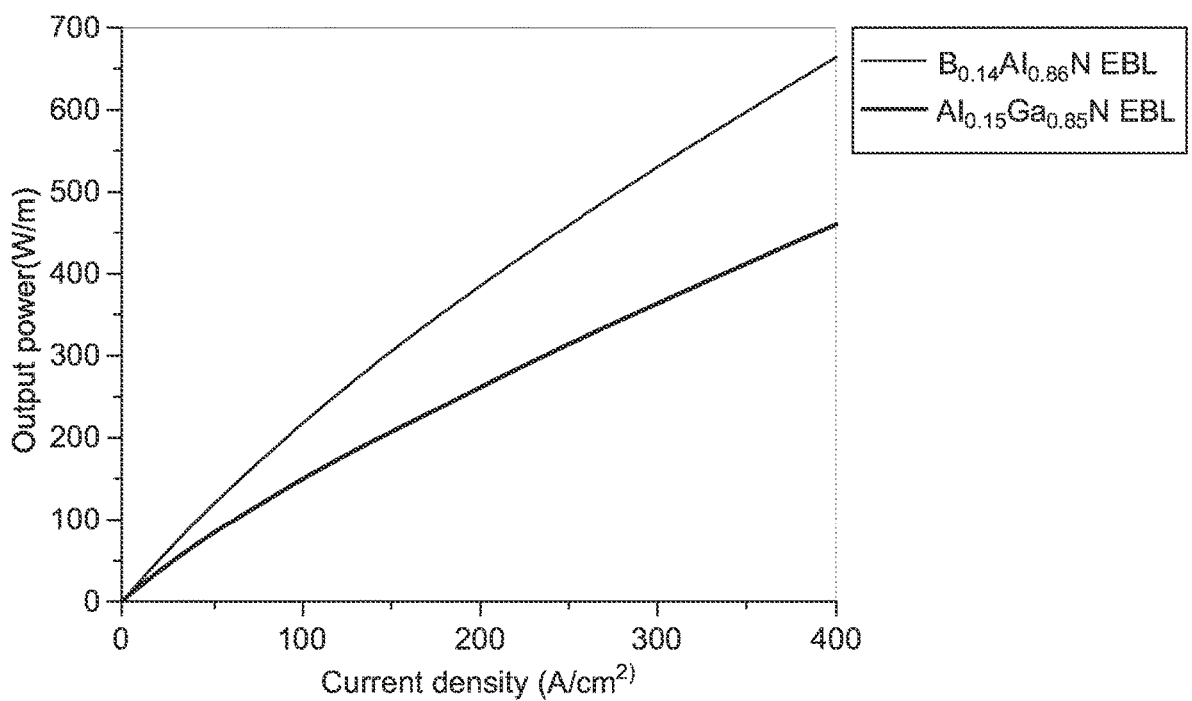
FIG. 6 is a graph of the output power versus current density of optoelectronic devices having different electron blocking layers according to embodiments.

As discussed above, one of the problems of an $Al_{0.15}Ga_{0.85}N$ electron blocking layer is a significant efficiency droop. Accordingly, the internal quantum efficiency (IQE) and the output power for the two light emitting diodes as functions of current density of the two light emitting diodes having different electron blocking layers were evaluated, the results of which are illustrated in FIGS. 5 and 6. As illustrated in FIG. 5, the optoelectronic device having a $B_{0.14}Al_{0.86}N$ electron blocking layer has a peak internal quantum efficiency of 88% and the optoelectronic device having an $Al_{0.15}Ga_{0.85}N$ electron blocking layer has a peak internal quantum efficiency of 80%. Further, at a current density of 400 A/cm², the optoelectronic device having an $Al_{0.15}Ga_{0.85}N$ electron blocking layer exhibits a 62% internal quantum efficiency droop from its peak internal quantum efficiency, whereas the optoelectronic device having a $B_{0.14}Al_{0.86}N$ electron blocking layer exhibits a 30% internal quantum efficiency droop from its peak internal quantum efficiency. Thus, the optoelectronic device having a $B_{0.14}Al_{0.86}N$ electron blocking layer operates more efficiently at higher current densities than the optoelectronic device having an $Al_{0.15}Ga_{0.85}N$ electron blocking layer.

The optoelectronic device having a $B_{0.14}Al_{0.86}N$ electron blocking layer produces a higher output power versus current density, which is illustrated in FIG. 6. As illustrated, the difference in output power of the optoelectronic devices $B_{0.14}Al_{0.86}N$ and $Al_{0.15}Ga_{0.85}N$ diverges as current density increases. This is due to the smaller internal quantum efficiency droop and larger emission rate of the optoelectronic device having a $B_{0.14}Al_{0.86}N$ electron blocking layer compared to that of the optoelectronic device having an $Al_{0.15}Ga_{0.85}N$ electron blocking layer.

Figure 7:
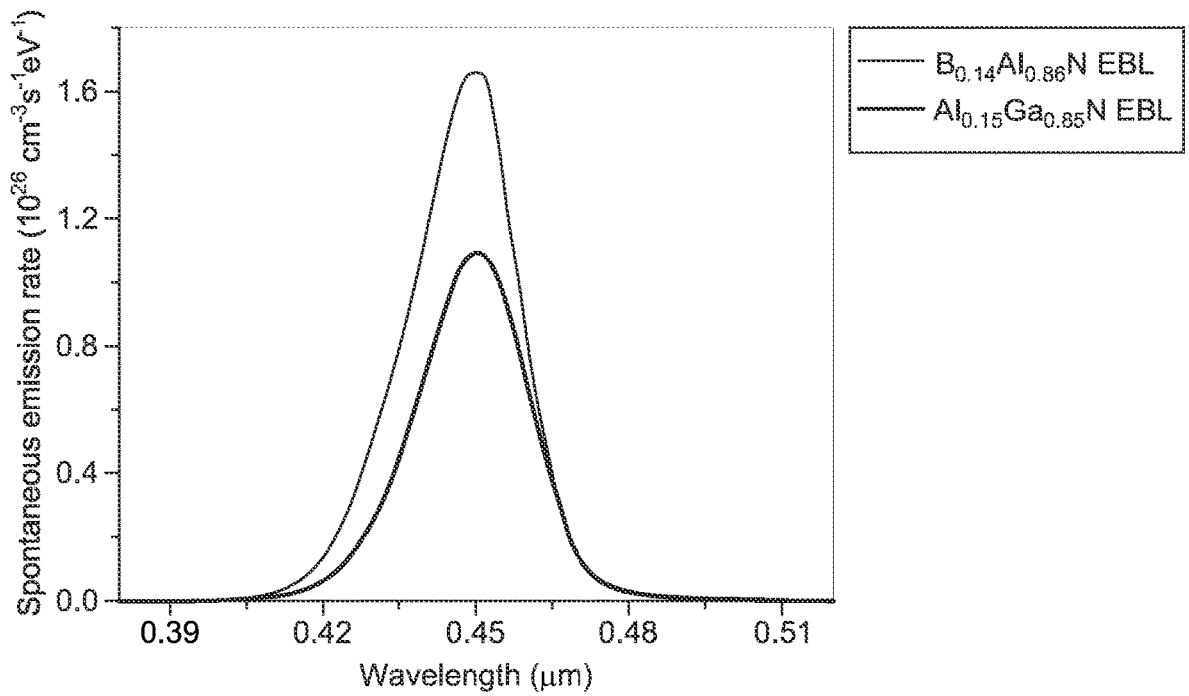
FIG. 7 is a graph of the spontaneous emission rate versus wavelength of optoelectronic devices having different electron blocking layers according to embodiments.

The optoelectronic device having a $B_{0.14}Al_{0.86}N$ electron blocking layer also produces a stronger light emission at the desired wavelength of approximately 450 nm, which corresponds to blue light emission, as illustrated in FIG. 7. Specifically, at 450 nm, the optoelectronic device having a $B_{0.14}Al_{0.86}N$ electron blocking layer has a spontaneous emission rate of approximately $1.6 \times 10^{26}$ cm$^{-3}$ s$^{-1}$ eV$^{-1}$, whereas the optoelectronic device having an AlGaN electron blocking layer exhibits a spontaneous emission rate of approximately $1 \times 10^{26}$ cm$^{-3}$ s$^{-1}$ eV$^{-1}$.

Figure 8:
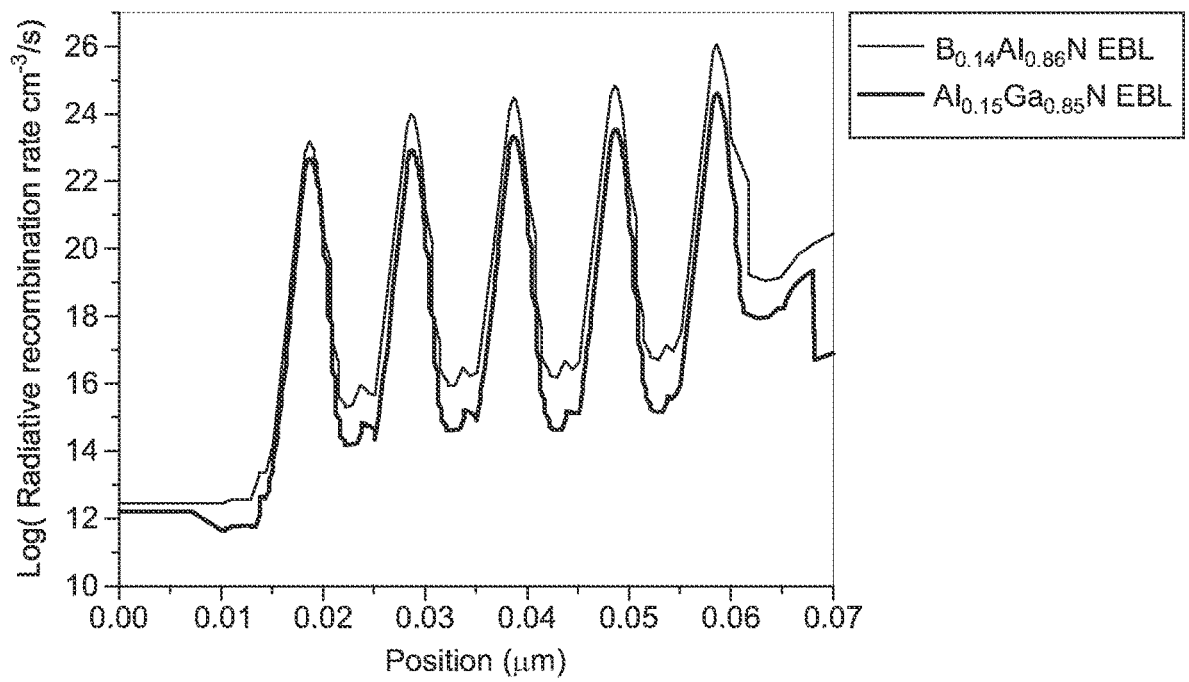
FIG. 8 is a graph of the logarithmic radiative recombination rates of optoelectronic devices having different electron blocking layers according to embodiments.

The optoelectronic device having a $B_{0.14}Al_{0.86}N$ electron blocking layer enhances the radiative recombination rate compared to one having an $Al_{0.15}Ga_{0.85}N$ electron blocking layer, which is illustrated in FIG. 8. As illustrated, the logarithmic radiative recombination rates (i.e., the photo or light generation rate) of an optoelectronic device having a $B_{0.14}Al_{0.86}N$ electron blocking layer exhibits higher peaks and valleys compared to an optoelectronic device having an $Al_{0.15}Ga_{0.85}N$ electron blocking layer. It should be noted that in FIG. 8, the positions from 0.01 to 0.07 represent the positions of the multiple quantum well layer.

FIGS. 3A-8 illustrate the performance characteristics of a blue LED. The boron aluminum nitride electron blocking layer of the present invention can also be used with other types of light emitting diodes, such as ultraviolet light emitting diodes, an example of which will now be described in connection with FIGS. 9-14.

Figure 9:
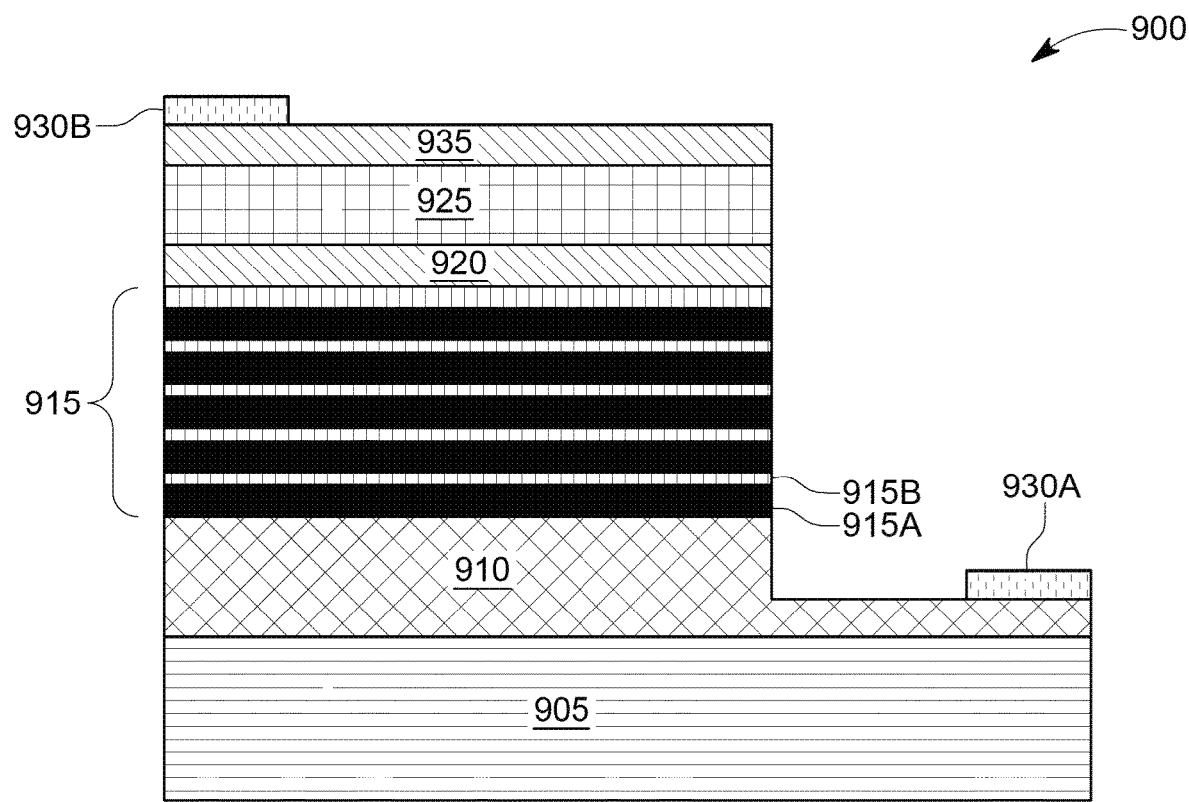
FIG. 9 is a block diagram of an optoelectronic device according to embodiments.

FIG. 9 illustrates an optoelectronic device, which in the illustrated embodiments is an ultraviolet LED, according to an embodiment. Similar numbering is employed to that of FIG. 1. The optoelectronic device 900 includes a substrate 905 and a first doped contact layer 910 arranged on the substrate 905. A multiple quantum well layer 915 is arranged on the first doped contact layer 910. A boron nitride alloy electron blocking layer 920 is arranged on the multiple quantum well layer 915. A second doped contact layer 925 is arranged on the boron nitride alloy electron blocking layer 920. A cap layer 935 is arranged on the second doped contact layer 925. The cap layer 935 reduces contact resistance. It should be noted that a cap layer is not required in the device 100 of FIG. 1 because the device 100 includes an aluminum gallium nitride second contact layer 125 as the top layer, which effectively performs the function of a cap layer.

In an embodiment, the substrate 905 can be, for example, a sapphire substrate. The first doped contact layer 910 can be, for example, a 3 μm n-type aluminum gallium nitride layer having a composition of $Al_{0.20}Ga_{0.80}N$. The doping of the first contact layer 910 can be, for example, $5 \times 10^{18}$ cm$^{-3}$ n-type doping (e.g., silicon doping). The multiple quantum well layer 915 comprises a plurality of interlaced barrier layers 915A and active layers 915B (only two of which are labeled). In an embodiment, the barrier layers 915A can be, for example, 8 nm thick aluminum gallium nitride layers and the active layers 915B can be, for example, 2 nm thick gallium nitride layers. In one embodiment, the aluminum gallium nitride barrier layers 915B can be $Al_{0.20}Ga_{0.80}N$ layers. Unlike the blue light emitting diode of FIG. 1, the ultraviolet light emitting diode of FIG. 9 does not include a sixth barrier layer as part of the multiple quantum well layer 915. Although the illustrated embodiment includes five barrier 915A and active 915B layers, the multiple quantum well layer 915 can include more or fewer than five barrier 915A and active 915B layers.

The boron nitride alloy layer 920 can be, for example, boron aluminum nitride layer. In one embodiment, the composition of the boron nitride alloy layer 920 is $B_{0.14}Al_{0.86}N$. It should be recognized, however, that the amount of boron and aluminum can be different from $B_{0.14}Al_{0.86}N$, so long as there is some boron, which as discussed below results in an optoelectronic device with a bandedge profile that contributes to a higher electron blocking barrier and lower hole barrier so that fewer electrons escape from the active layers and more holes are injected into the active layers. The second doped contact layer 925 can be, for example, a 100 nm p-type aluminum gallium nitride layer having a composition of $Al_{0.10}Ga_{0.90}N$. The doping of the second contact layer 925 can be, for example, $5\times10^{17}$ cm$^{-3}$ p-doping (e.g., magnesium doping). The cap layer 935 can be, for example, a 10-nm thick gallium nitride layer having $5\times10^{18}$ cm$^{-3}$ p-doping. The optoelectronic device 900 also includes electrodes 930A and 930B for powering the device. In an embodiment, the ultraviolet light emitting diode 900 has, for example, a rectangular shape having an area of 200×200 µm$^2$.

The method of producing the ultraviolet light emitting diode is similar to that described above in connection with the blue light emitting diode with the additional step of forming the cap layer 935 on top of the second doped contact layer.

The disclosed optoelectronic device having a boron nitride alloy electron blocking layer was evaluated with respect to a similar device having an aluminum gallium nitride electron block layer. The two devices were identical except for the composition of the electron blocking layer. Specifically, the boron nitride alloy electron blocking layer was a 10 nm thick $B_{0.14}Al_{0.86}N$ layer, whereas the aluminum gallium nitride electron blocking layer was a 10 nm thick $Al_{0.30}Ga_{0.70}N$ layer.

Figure 10:
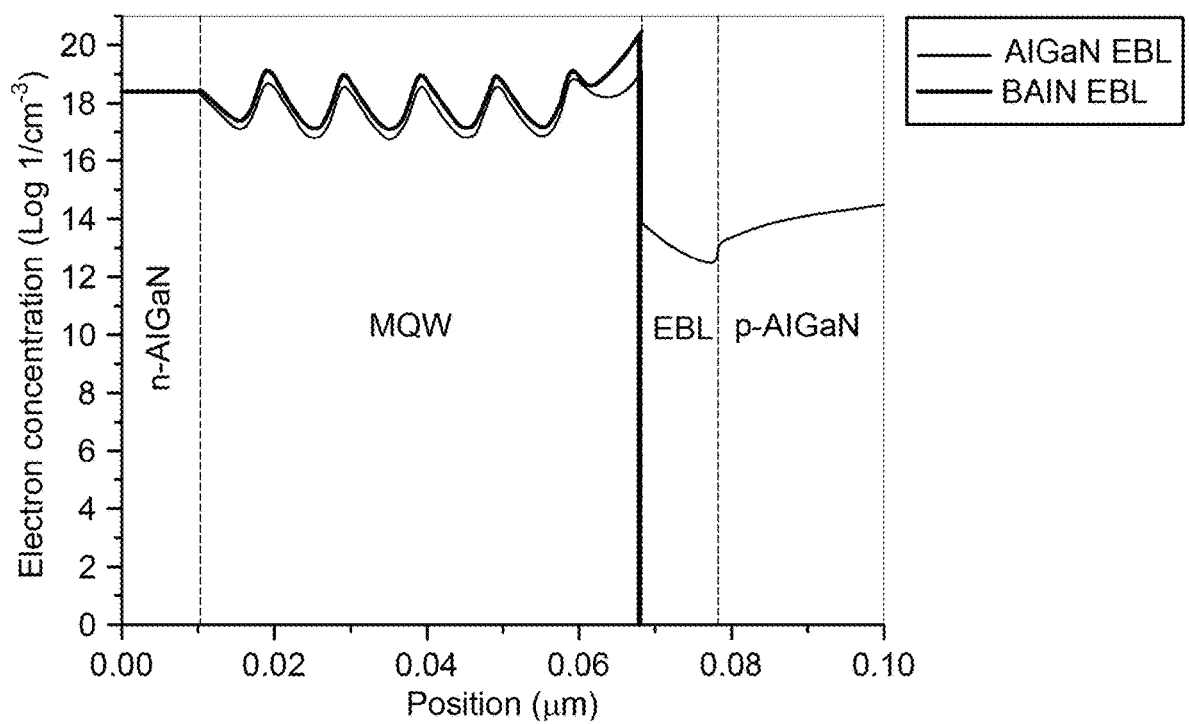
FIGS. 10 and 11 are graphs of electron and hole carrier density, respectively, of optoelectronic devices having different electron blocking layers according to embodiments.
Figure 11:
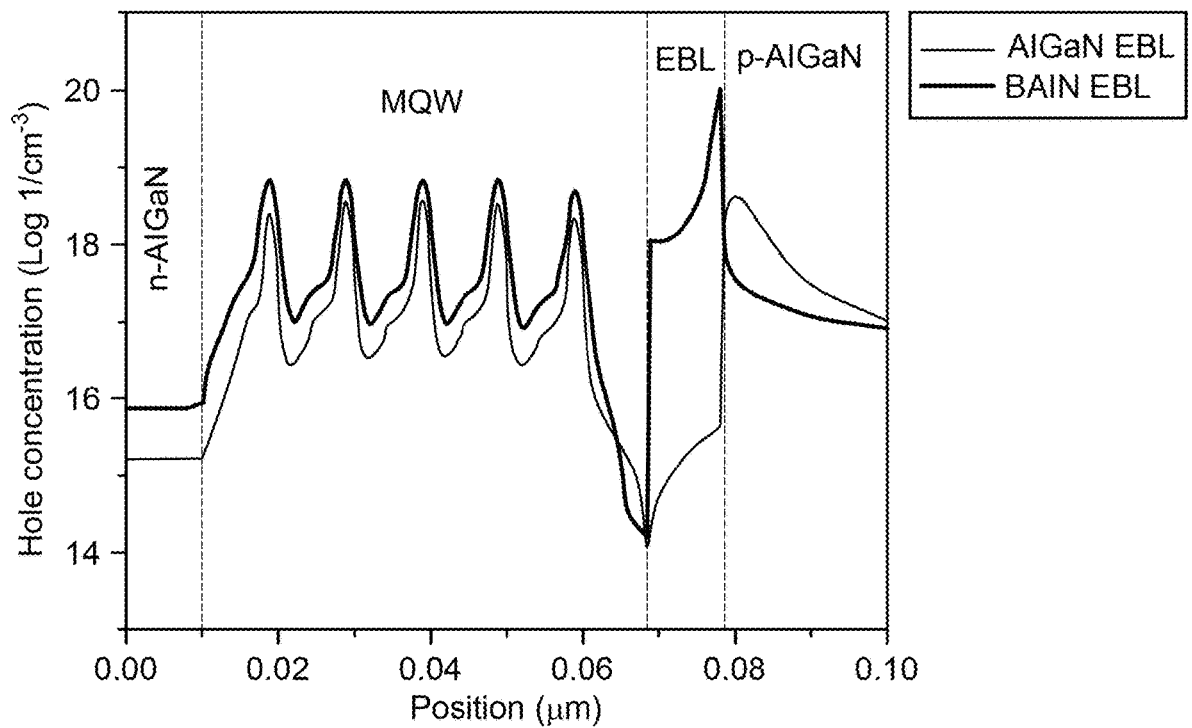

To understand the corresponding carrier distribution, the electron and hole concentrations at the current density of 200 A/cm$^2$ were evaluated, the results of which are illustrated in logarithmic scale in FIGS. 10 and 11. Due to the high conduction band barrier height for electrons and low valence band barrier height for holes, the $B_{0.14}Al_{0.86}N$ p-type electron blocking layer simultaneously facilitates the efficient electron blocking and hole injection into the active region, giving rise to the higher carrier concentration level in the multiple quantum wells and less electron leakage into the p-type aluminum gallium nitride layer as will be appreciated by comparing FIGS. 10 and 11.

Figure 12:
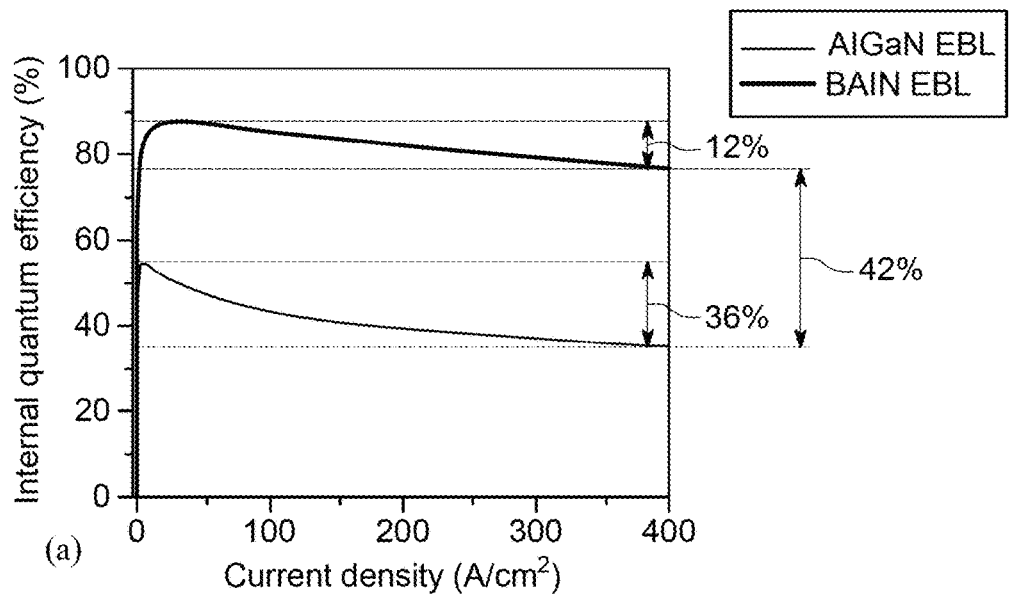
FIG. 12 is a graph of the internal quantum efficiency of optoelectronic devices having different electron blocking layers according to embodiments.
Figure 13:
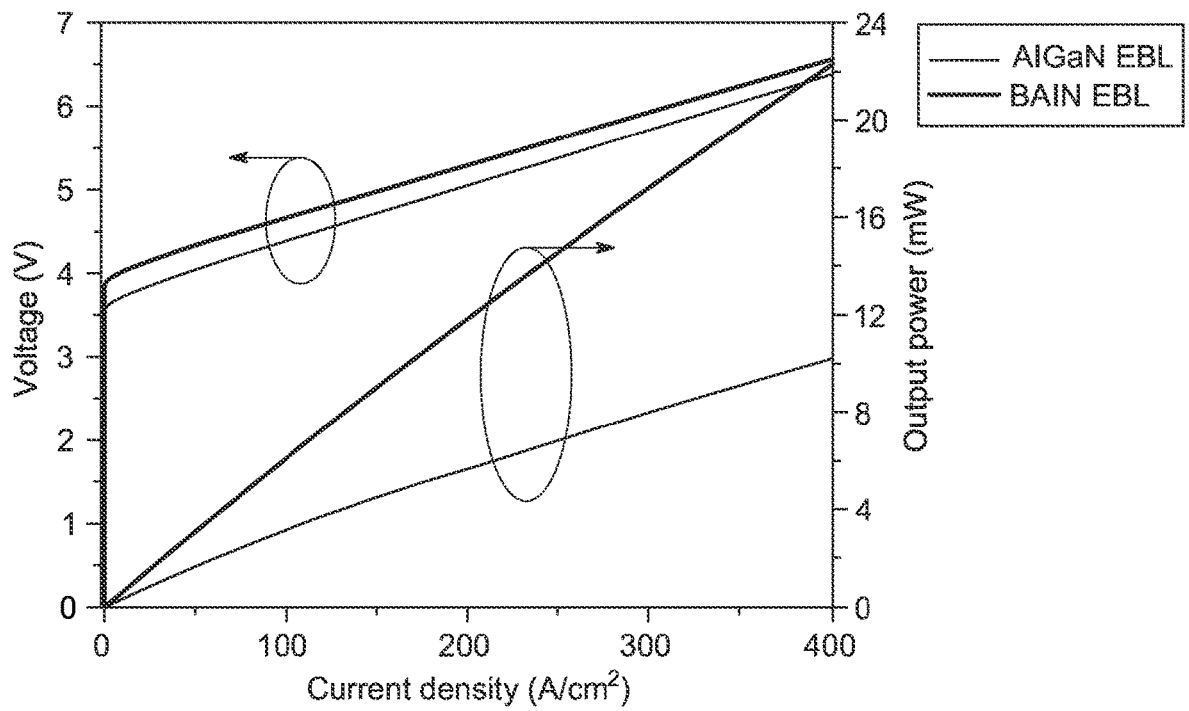
FIG. 13 is a graph of the output power and voltage versus current density of optoelectronic devices having different electron blocking layers according to embodiments.

The internal quantum efficiency, the forward voltage relationship, and the output power for the two light emitting diodes as functions of current density of the two ultraviolet light emitting diodes having different electron blocking layers were evaluated, the results of which are illustrated in FIGS. 12 and 13. As illustrated in FIG. 12, the $B_{0.14}Al_{0.86}N$ p-type electron blocking layer improves the efficiency at the current density of 400 A/cm$^2$ by 42% over the device having an $Al_{0.30}Ga_{0.70}N$ p-type electron blocking layer. Furthermore, the $B_{0.14}Al_{0.86}N$ p-type electron blocking layer attenuates the efficiency droop (defined as the ratio of the drop of efficiency from the peak value) by 24%.

As illustrated by the two lower curves in FIG. 13 (identified in the figure by a circle with an arrow pointing to the right-hand vertical axis), the output power of the ultraviolet light emitting diode improves from 10 mW to 22 mW at the current density of 400 A/cm$^2$ when using a $B_{0.14}Al_{0.86}N$ p-type electron blocking layer compared to an $Al_{0.30}Ga_{0.70}N$ p-type electron blocking layer. The significant enhancement of both internal quantum efficiency and output power are due to the improved carrier injection achieved using the $B_{0.14}Al_{0.86}N$ p-type electron blocking layer.

As illustrated by the two upper curves in FIG. 13 (identified in the figure by a circle with an arrow pointing to the left-hand vertical axis) the current-voltage (I-V) curve indicates that the $B_{0.14}Al_{0.86}N$ p-type electron blocking layer causes a larger turn-on voltage of 3.8 V when compared with that of 3.5 V for the light emitting diode with the $Al_{0.30}Ga_{0.70}N$ p-type electron blocking layer. The large turn-on voltage originates from the large sheet resistance caused by high activation energy for the dopants in the wide-bandgap $B_{0.14}Al_{0.86}N$ p-type electron blocking layer. Moreover, the light emitting diode with a $B_{0.14}Al_{0.86}N$ p-type electron blocking layer also possesses a larger forward voltage after the device is turned on.

In order to provide a comprehensive understanding of the power conversion efficiency, the wall-plug efficiency (WPE) (defined as the ratio of output power to input power) was calculated. It was determined that the wall-plug efficiency of the ultraviolet light emitting diode with the $Al_{0.30}Ga_{0.70}N$ p-type electron blocking layer is lower than 6%, while the ultraviolet light emitting diode with the $B_{0.14}Al_{0.86}N$ p-type electron blocking layer can contribute to the wall-plug efficiency of up to 8%. It was also determined that the wall-plug efficiency at the current density of 400 A/cm$^2$ was increased by 2.4% in the device having the $B_{0.14}Al_{0.86}N$ p-type electron blocking layer compared to the device having the $Al_{0.30}Ga_{0.70}N$ p-type electron blocking layer.

Figure 14:
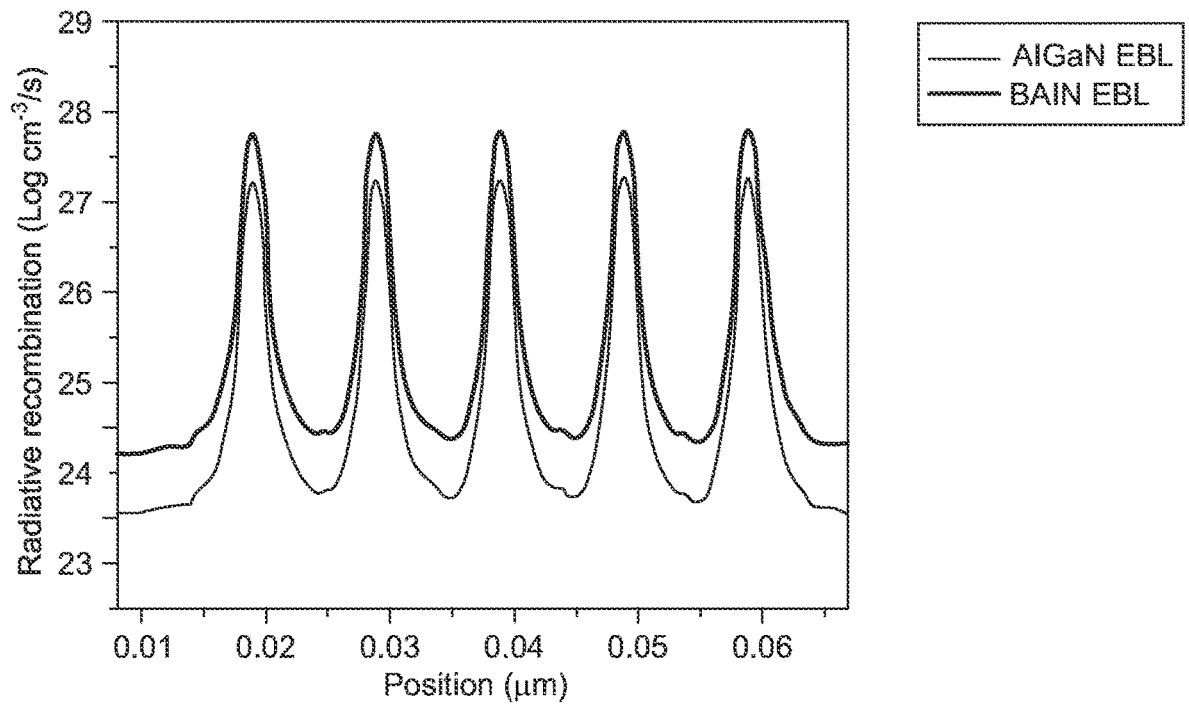
FIG. 14 is a graph of the logarithmic radiative recombination rates of optoelectronic devices having different electron blocking layers according to embodiments.

The ultraviolet light emitting diode having the $B_{0.14}Al_{0.86}N$ p-type electron blocking layer exhibits greater emitted light intensity compared to one having the $Al_{0.30}Ga_{0.70}N$ p-type electron blocking layer. Emitted light intensity is determined by the radiative recombination process within the active region. A comparison of the radiative recombination rate (logarithmic scale) in the active region, at a current density of 200 A/cm$^2$, between the ultraviolet light emitting diodes with the $Al_{0.30}Ga_{0.70}N$ p-type electron blocking layer and with the $B_{0.14}Al_{0.86}N$ p-type electron blocking layer is illustrated in FIG. 14. As illustrated, the device having a $B_{0.14}Al_{0.86}N$ p-type electron blocking layer exhibits a peak radiative recombination rate that is approximately four times higher than that of a device having an $Al_{0.30}Ga_{0.70}N$ p-type electron blocking layer (i.e., an increase from 27.2 to 27.8 in the logarithmic scale). The enhanced radiative recombination rate is due to the increased carrier concentration in the active region of the device having a $B_{0.14}Al_{0.86}N$ p-type electron blocking layer compared to a device having an $Al_{0.30}Ga_{0.70}N$ p-type electron blocking layer.

Figure 15:
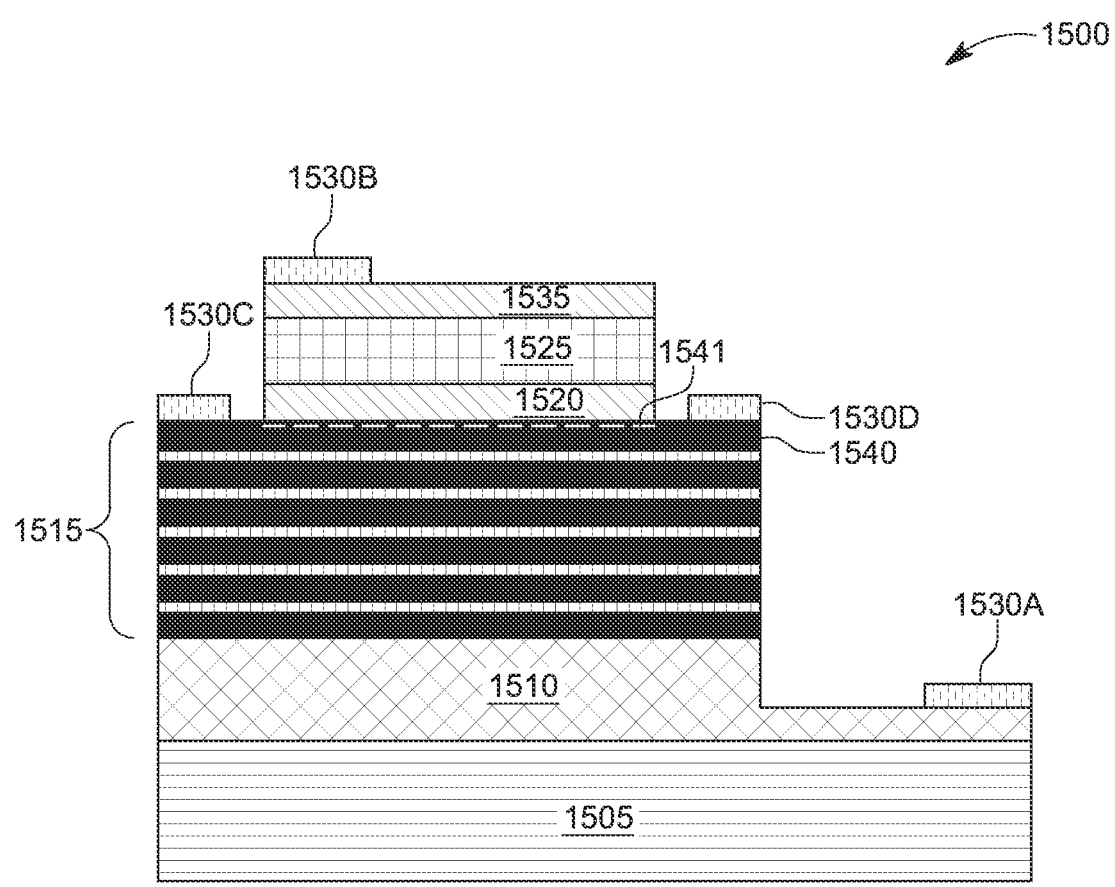
FIG. 15 is a block diagram of an optoelectronic device having a monolithically integrated light emitting diode and high electron mobility transistor according to embodiments.

FIG. 15 is a block diagram of an optoelectronic device according to embodiments. The numbering in FIG. 15 is similar to the numbering in FIGS. 1 and 9. The optoelectronic device 1500 is a combined light emitting diode and high electron mobility transistor (HEMT). Specifically, the device 1500 includes a light emitting diode comprising a multiple quantum well layer 1515, electron blocking layer 1520, and two doped contact layers 1510 and 1525. The device also includes a high electron mobility transistor comprising a boron nitride alloy electron blocking layer 1520 and a portion of the last quantum barrier layer 1540 as a two-dimensional electron gas (2DEG) 1541 channel. Thus, as illustrated, the channel 1541 is comprised of a portion of the last quantum barrier layer 1540 of the multiple quantum well layer 1515. The boron nitride alloy electron blocking layer 1520 is arranged on the channel 1541 of the high electron mobility transistor.

The device 1500 also includes a substrate 1505, a first doped contact layer 1510 interposed between the substrate 1505 and the multiple quantum well layer 1515, a second doped contact layer 1525 arranged on top of the boron nitride alloy electron blocking layer 1520, a cap layer 1535 arranged on top of the second doped contact layer 1525 of the high electron mobility transistor. Contacts 1530A and 1530B are respectively arranged on top of the first doped layer 1510 and the cap layer 1535, serving as current sink and source for light emitting diode, respectively. Contact

15308 also serves as the gate of the high electron mobility transistor. Optionally, another contact can be arranged on top of the cap layer 1535 to exclusively serve as the gate of high electron mobility transistor. Contacts 1530C and 1530D are the drain and source of the high electron mobility transistor, respectively, and are arranged on top of the last quantum barrier layer 1540. The compositions and dimensions of the various layers can be the same or different from those in the devices of FIGS. 1 and 9.

The boron nitride alloy electron blocking layer 1520 allows a portion of the last quantum barrier 1540 of the multiple quantum well layer 1515 to function as the two-dimensional electron gas 1541 channel of the high electron mobility transistor. Specifically, the large lattice mismatch between the boron nitride alloy electron blocking layer 1520 and the low aluminum content aluminum gallium nitride or gallium nitride 1540 layer (serving as the last quantum well barrier layer) induces a very strong electric field at the interface between these two layers, which, as illustrated in FIG. 3A causes a severe downward bending of the energy band. This severe downward bending at the interface resembles a two-dimensional electron gas channel in a high electron mobility transistor, and accordingly the last quantum barrier layer 1540 can be shared between the light emitting diode and high electron mobility transistor to provide a monolithically integrated light emitting diode and high electron mobility transistor that is less expensive and smaller than conventional light emitting diode and high electron mobility transistor combinations.

It should be recognized that instead of taking advantage of the severe dip at the interface to form a monolithically integrated light emitting diode and high electron mobility transistor, the dip can be reduced in a light emitting diode by increasing the aluminum content of the last quantum barrier layer 1540. The thickness and amount of doping (as applicable) of each layer in FIG. 15 can be the same or similar to the corresponding layers in FIG. 9. Although FIG. 15 illustrates a monolithic device combining a high electron mobility transistor and a UV light limiting diode, such a monolithic device can combine any type of light emitting diode with a high electron mobility transistor, such as the blue light emitting diode described above in connection with FIG. 1.

Although exemplary embodiments have been described in connection with light emitting diodes, the disclosed electron blocking layer can be used in other types of optoelectronic devices in which electron leakage from the active layer is to be reduced or eliminated.

The disclosed embodiments provide an optoelectronic device and method of production. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An optoelectronic device, comprising:
    a substrate;
    a first doped contact layer arranged on the substrate;
    a multiple quantum well layer arranged on the first doped contact layer;
    a boron nitride alloy electron blocking layer arranged in contact with a last active layer of the multiple quantum well layer for increasing an electron blocking barrier and lowering a hole barrier relative to the multiple quantum well layer; and
    a second doped contact layer arranged on the boron nitride alloy electron blocking layer,
    wherein the boron nitride alloy electron blocking layer comprises $B_xAl_{1-x}N$, where B is boron, Al is aluminum, and N is nitrogen and where x is non-zero.

2. The optoelectronic device of claim 1, wherein the first doped contact layer is an n-type contact layer and the second doped contact layer is a p-type contact layer.

3. The optoelectronic device of claim 1, wherein x in the boron nitride alloy electron blocking layer is 0.14 and 1−x is 0.86.

4. The optoelectronic device of claim 1, wherein the first and second doped contact layers comprise gallium nitride.

5. The optoelectronic device of claim 1, wherein the first and second doped contact layers comprise aluminum gallium nitride.

6. The optoelectronic device of claim 1, wherein the multiple quantum well layer comprises:
    at least one layer of gallium nitride; and
    at least one layer of aluminum gallium nitride.

7. The optoelectronic device of claim 1, wherein the multiple quantum well layer comprises:
    at least one layer of gallium nitride; and
    at least one layer of indium gallium nitride.

8. The optoelectronic device of claim 1, wherein the optoelectronic device is a blue light emitting diode or an ultra-violet light emitting diode.

9. A method of forming an optoelectronic device, the method comprising:
    forming a first doped contact layer on a substrate;
    forming a multiple quantum well layer on the first doped contact layer;
    forming a boron nitride alloy electron blocking layer in contact with a last active layer of the multiple quantum well layer so that an amount of boron and an amount of aluminum in the boron nitride alloy electron blocking layer has the following relationship: $B_xAl_{1-x}N$, where x is non-zero; and
    forming a second doped contact layer on the boron nitride alloy electron blocking layer.

10. The method of claim 9, wherein the forming of the boron nitride alloy electron blocking layer has x=0.14 and 1−x=0.86.

11. The method of claim 9, wherein the formation of the first and second doped contact layers comprises:
    forming the first doped contact layer as an n-doped layer; and
    forming the second doped contact layer as a p-type layer.

12. The method of claim 9, wherein the formation of the multiple quantum well layer comprises:
    forming at least one layer of gallium nitride; and
    forming at least one layer of indium gallium nitride.

* * * * *